(12) United States Patent
Chatty et al.

(10) Patent No.: US 10,062,749 B2
(45) Date of Patent: Aug. 28, 2018

(54) HIGH VOLTAGE SEMICONDUCTOR DEVICES AND METHODS OF MAKING THE DEVICES

(71) Applicant: Monolith Semiconductor, Inc., Ithaca, NY (US)

(72) Inventors: Kiran Chatty, Oviedo, FL (US); Kevin Matocha, El Dorado, AR (US); Sujit Banerjee, San Jose, CA (US); Larry Burton Rowland, Scotia, NY (US)

(73) Assignee: Monolith Semiconductor Inc., Round Rock, TX (US)

( * ) Notice: Subject to any disclaimer, the term of this patent is extended or adjusted under 35 U.S.C. 154(b) by 556 days.

(21) Appl. No.: 14/303,019

(22) Filed: Jun. 12, 2014

(65) Prior Publication Data

US 2014/0367771 A1 Dec. 18, 2014

Related U.S. Application Data

(60) Provisional application No. 61/836,328, filed on Jun. 18, 2013.

(51) Int. Cl.
*H01L 29/66* (2006.01)
*H01L 29/06* (2006.01)
*H01L 29/78* (2006.01)
*H01L 29/10* (2006.01)
*H01L 29/423* (2006.01)
*H01L 29/08* (2006.01)

(52) U.S. Cl.
CPC ...... *H01L 29/0623* (2013.01); *H01L 29/0619* (2013.01); *H01L 29/66712* (2013.01); *H01L 29/66719* (2013.01); *H01L 29/7802* (2013.01); *H01L 29/7813* (2013.01); *H01L 29/0696* (2013.01); *H01L 29/0878* (2013.01); *H01L 29/1095* (2013.01); *H01L 29/42368* (2013.01); *H01L 29/42376* (2013.01)

(58) Field of Classification Search
CPC ......... H01L 29/7827; H01L 29/66666; H01L 29/7802; H01L 29/0619; H01L 29/407; H01L 29/66712; H01L 29/7395; H01L 29/0623; H01L 29/0847; H01L 29/1095
USPC .......................................................... 257/77
See application file for complete search history.

(56) References Cited

U.S. PATENT DOCUMENTS

| | | | |
|---|---|---|---|
| 6,198,129 B1 * | 3/2001 | Murakami | H01L 29/7802 257/339 |
| 8,354,715 B2 | 1/2013 | Kono et al. | |
| 8,866,150 B2 * | 10/2014 | Das | H01L 21/0475 257/77 |
| 2003/0227052 A1 * | 12/2003 | Ono | H01L 29/407 257/341 |

(Continued)

*Primary Examiner* — Eric Ward
*Assistant Examiner* — Eric Ashbahian
(74) *Attorney, Agent, or Firm* — Maier & Maier, PLLC

(57) ABSTRACT

Metal-oxide-semiconductor field-effect transistor (MOSFET) devices are described which have a p-type region between the p-type well regions of the device. The p-type region can be either floating or connected to the p-type well regions by additional p-type regions. MOSFET devices are also described which have one or more p-type regions connecting the p-type well regions of the device. The p-type well regions can be arranged in a various geometric arrangements including square, diamond and hexagonal. Methods of making the devices are also described.

12 Claims, 24 Drawing Sheets

(56) References Cited

U.S. PATENT DOCUMENTS

| | | | |
|---|---|---|---|
| 2003/0235942 A1 | 12/2003 | Nakamura et al. | |
| 2011/0057202 A1* | 3/2011 | Kono | H01L 29/0619 257/77 |
| 2012/0161157 A1* | 6/2012 | Inoue | C30B 29/36 257/77 |
| 2013/0221403 A1* | 8/2013 | Lu | H01L 21/761 257/139 |
| 2013/0341643 A1* | 12/2013 | Kudou | H01L 29/66068 257/77 |
| 2014/0183553 A1 | 7/2014 | Zhang et al. | |
| 2014/0264564 A1* | 9/2014 | Cheng | H01L 29/7827 257/330 |

* cited by examiner

HIGH VOLTAGE SEMICONDUCTOR DEVICES AND METHODS OF MAKING THE DEVICES

This application claims the benefit or Provisional U.S. Patent Application Ser. No. 61/836,328, filed on Jun. 18, 2013, which application is incorporated by reference herein in its entirety.

STATEMENT REGARDING FEDERALLY SPONSORED RESEARCH OR DEVELOPMENT

This invention was made with government support under Grant No. DE-AR0000442 awarded by the Department of Energy. The government has certain rights in this invention.

BACKGROUND

Technical Field

The present invention relates to semiconductor devices for high-voltage power electronic applications and methods of making the devices.

Background of the Technology

The properties of silicon carbide are ideally suited for high-voltage power electronic applications. One of the main advantages of silicon carbide over silicon is its higher critical breakdown field strength. Silicon carbide has a breakdown field strength of approximately 3 MV/cm compared to 0.3 MV/cm for silicon. The 10× higher breakdown field strength of silicon carbide enables semiconductor switches and rectifiers with higher reverse blocking voltages and lower on state resistance enabling superior power electronic system performance than possible with silicon.

While the higher breakdown field strength of silicon carbide enables a higher breakdown voltage, it also results in a higher electric field in the regions above the semiconductor such as the gate dielectric and passivation regions above the semiconductor device. The high electric fields in the gate oxide and the passivation regions can result in short term or long term reliability issues such as premature breakdown of gate dielectric or the dielectric material in the passivation regions. Thus, there is a need to reduce the electric field in the gate dielectric to mitigate potential reliability issues.

A commonly used power semiconductor switch is the Double-Diffused MOSFET or DMOSFET. During on-state of the DMOSFET, the application of a gate bias greater than the threshold voltage results in current flow from the source terminal at the top of the structure to the drain terminal at the bottom of the structure. During the off-state of the DMOSFET, the drain terminal is biased at high voltage (for example, the drain to source voltage can be at 1200 volts), the gate and source terminals are biased at the ground potential corresponding to 0 volts. The large reverse voltage is supported by the depletion region of the P-N junction diode formed by P-well to N-drift regions.

The thin gate oxide above the JFET region in the DMOSFET device is shielded from the reverse voltage (and electric field) by the merged depletion regions from the P-well to N-drift junctions on the left and right side of the JFET region. When the JFET region width is large, there is ineffective shielding of the gate oxide by the merged depletion region resulting in high electric field in the gate oxide. When the JFET region width is small, the merged depletion regions effectively shield the gate oxide from high electric fields. However, the total on-state resistance of the DMOSFET increases due to increased JFET region resistance; a result of the narrow JFET region width. There is a trade-off between increased device on-resistance per unit area (also referred to as specific on-state resistance) and the electric field in the gate oxide.

Thus, there is a need for a structure in the art that enables a lower electric field in the gate oxide while minimizing the specific on-state resistance of the device.

SUMMARY

A semiconductor device is provided which comprises:
a semiconductor substrate layer of a first conductivity type;
optionally, a buffer layer of a semiconductor material of the first conductivity type on the substrate layer;
a drift layer of a semiconductor material of the first conductivity type on the buffer layer or on the substrate;
a first well region of a semiconductor material of a second conductivity type different than the first conductivity type in the drift layer in a central portion of the device;
a second well region of a semiconductor material of the second conductivity type in the drift layer in the central portion of the device and spaced from the first well region;
a pillar region of a semiconductor material of the second conductivity type in the drift layer between the first well region and the second well region and spaced from the first well region and the second well region;
a first source region of a semiconductor material of the first conductivity in the first well region;
a second source region of a semiconductor material of the first conductivity in the second well region;
a first gate dielectric layer on the drift layer and in contact with the first source region and the second source region;
a gate electrode on a central portion of the first gate dielectric layer, the gate electrode comprising a lower surface on the first gate dielectric layer, an upper surface opposite the lower surface and sidewalls;
an interlayer dielectric on the gate electrode and on a peripheral portion of the first gate dielectric layer not covered by the gate electrode;
source ohmic contacts on the source regions; and
a source metal region in contact with the source ohmic contacts.

A semiconductor device is also provided which comprises:
a semiconductor substrate layer of a first conductivity type;
optionally, a buffer layer of a semiconductor material of the first conductivity type on the substrate layer;
a drift layer of a semiconductor material of the first conductivity type on the buffer layer or on the substrate;
a first well region of a semiconductor material of a second conductivity type different than the first conductivity type in the drift layer in a central portion of the device;
a second well region of a semiconductor material of the second conductivity type in the drift layer and spaced from the first well region in the central portion of the device;
one or more pillar regions of a semiconductor material of the second conductivity type in the drift layer and connecting the first and second well regions;
a first source region of a semiconductor material of the first conductivity in the first well region;
a second source region of a semiconductor material of the first conductivity in the second well region;

a first gate dielectric layer on the drift layer and in contact with the first source region and the second source region;

a gate electrode on a central portion of the first gate dielectric layer, the gate electrode comprising a lower surface on the first gate dielectric layer, an upper surface opposite the lower surface and sidewalls;

an interlayer dielectric on the gate electrode and on a peripheral portion of the first gate dielectric layer not covered by the gate electrode;

source ohmic contacts on the source regions; and a source metal region in contact with the source ohmic contacts.

A method of making a semiconductor device is also provided which comprises:

implanting first and second well regions in a drift layer of a semiconductor material of a first conductivity type, wherein the drift layer is on a substrate, wherein the first and second well regions are of a second conductivity type different than the first conductivity type and wherein the first and second well regions are spaced from one another by a drift region of semiconductor material of the first conductivity type;

implanting first and second source regions of the first conductivity type in the first and second well regions, respectively, wherein the first and second source regions are implanted to a depth less than the depth of the first and second well regions such that an underlying portion of the well region beneath the first and second source regions remains and an inner portion of the first and second well regions adjacent the drift region remains;

implanting a pillar region of the second conductivity type in the drift region between the first and second well regions, wherein the pillar region is implanted to a depth equal to or greater than the first and second well regions;

implanting outer regions of the second conductivity type in an outer portion of the first and second source regions, in the underlying first and second well regions and in the underlying drift layer;

forming a gate oxide layer on an upper surface of: an inner portion of the first and second source regions; the first and second well regions; the drift region; and the pillar region, wherein an outer portion of the first and second source regions is exposed;

forming a polysilicon gate layer on the gate oxide layer, wherein the polysilicon gate layer is non-coextensive with the underlying gate oxide layer such that outer portions of the gate oxide layer over the first and second source regions are exposed;

forming an interlayer dielectric over the poly-silicon gate layer, wherein the interlayer dielectric is in contact with the outer portions of the gate oxide layer;

forming first and second source contacts on the outer regions and on the exposed outer portions of the first and second source regions, respectively;

forming a drain contact on the surface of the substrate opposite the drift layer; and forming a metal layer over the interlayer dielectric and over the first and second source contacts.

BRIEF DESCRIPTION OF THE DRAWINGS

The above and further advantages of the invention may be better understood by referring to the following description in conjunction with the accompanying drawings, in which.

DETAILED DESCRIPTION

Figure 1:
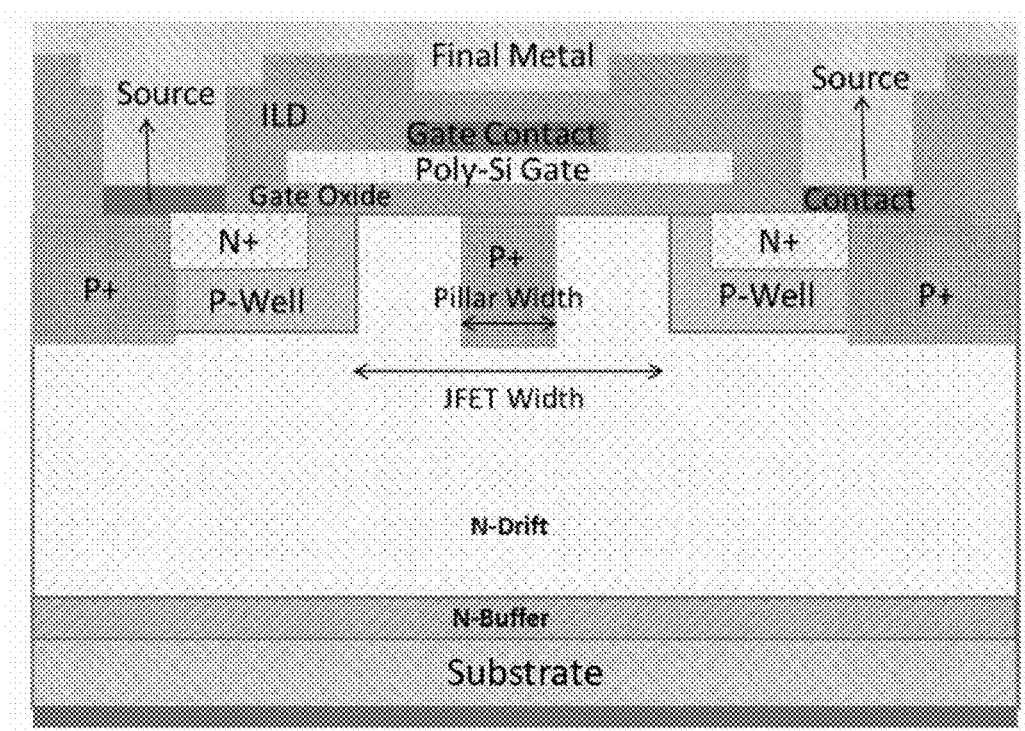
FIG. 1 is a cross-sectional view of a semiconductor device according to a first embodiment comprising a p-type pillar region between the p-type well regions of the device, wherein the p-type pillar region is more heavily doped than the p-type well regions.

The present invention will be described more fully hereinafter with reference to the accompanying drawings, in which some, but not all embodiments of the invention are shown. Indeed, this invention may be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative dimensions of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath", "underlying" and "overlying" may be used herein to describe a relationship of one layer or region to another layer or region relative to a substrate or base layer as illustrated in the figures. It will be understood that these terms are intended to encompass different orientations of the device in addition to the orientation depicted in the figures. The term "directly" means that there are no intervening elements. As used herein, the term "and/or" includes any and all combinations of one or more of the associated listed items.

It is to be understood that, although the terms "first", "second", etc. may be used herein to describe various elements, components, regions, layers and/or sections. These elements, components, regions, layers and/or sections, should not be limited by these terms. These terms are only used to distinguish one element, component, region, layer or section from another element, component, region, layer or section. Thus, a "first" element, component, region, layer or section discussed below could be termed a "second" element, component, region, layer or section without departing from the teachings of the present invention.

Embodiments of the invention are described herein with reference to cross-sectional, perspective, and/or plan-view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle may have rounded or curved features due to normal manufacturing tolerances. Thus, the layers and regions illustrated in the figures are schematic in nature and their shapes are not intended to illustrate the precise shape of a region or a shape of a device and are not intended to limit the scope of the invention.

It will be understood that all terms including technical and scientific terms used herein have the same meaning as commonly understood by those skilled in the art to which this invention belongs, unless otherwise defined. It will be also understood that terms, such as those defined in commonly used dictionaries, should be interpreted as having a meaning that is consistent with their meaning in the context of the relevant art and this specification will not be interpreted in an idealized or overly formal sense unless expressly so defined herein.

This invention describes different device structures and layouts for MOSFET devices. The device structure can minimize the electric field in the gate dielectric during reverse blocking state in Double-Diffused MOSFET (DMOSFET) devices.

FIG. 1 shows the cross-section of a device according to some embodiments. As shown in FIG. 1, the structure comprises a P-type region in the middle of the JFET region (referred to as P-Pillar). According to some embodiments, the p-type pillar region is a heavily doped p-region (referred to as a P+ region) with a doping concentration of greater than 5E18 cm$^{-3}$, a depth of 0.5 μm to 1 μm and a width less than or equal 1 μm. According to some embodiments, the depth of the P-type pillar region is the same or larger than the P-type well region. According to some embodiments, the width of the JFET region is between 3 μm and 6 μm. According to some embodiments, the P-type pillar region is connected to the source in the third dimension (not shown in FIG. 1).

As shown in FIG. 1, the device comprises a substrate. According to some embodiments, the substrate is an N-type substrate and the device is a metal-oxide-semiconductor field-effect transistor (MOSFET) device. According to some embodiments, the substrate is an P-type substrate and the device is an insulated gate bipolar transistor (IGBT) device.

During the on-state of a MOSFET device, current flows from the source terminal to the drain terminal in the gaps between the P-well and P-type pillar regions. During the off-state of the device, the depletion region between the P-well and N-drift and the P-type pillar region and N-drift region shield the gate dielectric from high electric fields.

According to some embodiments, the gate dielectric is silicon dioxide, also referred to as gate oxide.

As shown in FIG. 1, the device comprises a buffer layer. The buffer layer is optional. According to some embodiments, the thickness of the buffer layer is 0.5 μm to 10 μm (e.g., 0.5 μm to 2 μm). According to some embodiments, the doping concentration of the buffer layer is between $1\times10^{16}$ $cm^{-3}$ to $1\times10^{18}$ $cm^{-3}$. According to some embodiments, the doping concentration of the buffer layer is between $>1\times10^{18}$ $cm^{-3}$.

Figure 2:
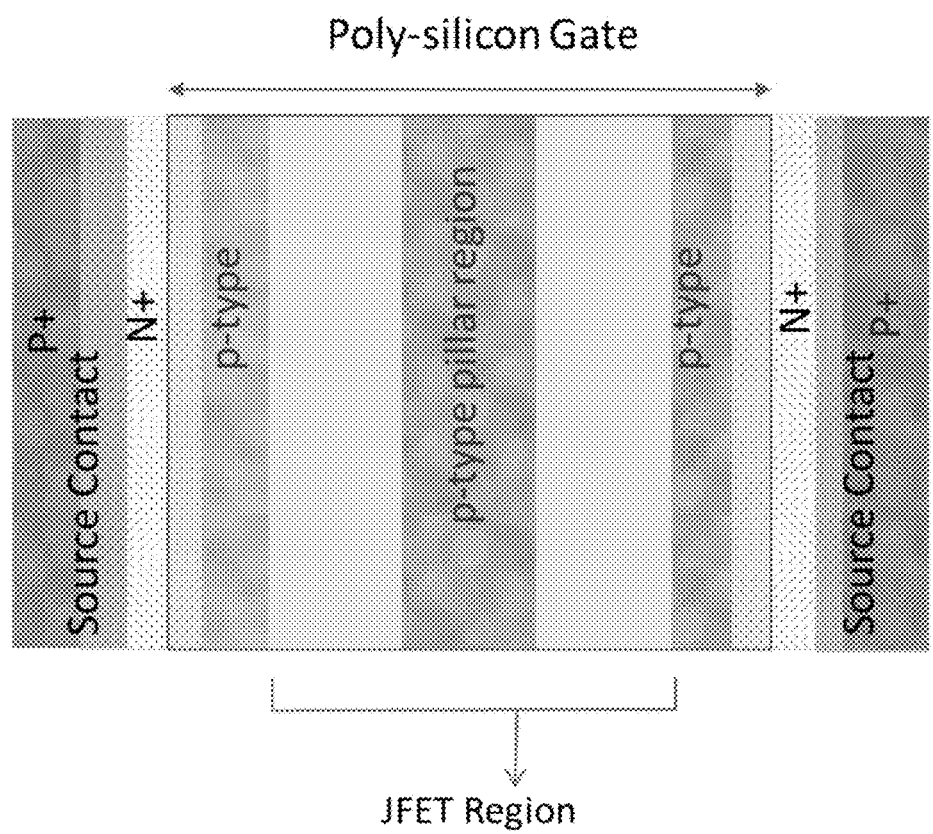
FIG. 2 is a top view of a device wherein the pillar, well and source regions are arranged as parallel stripes.

FIG. 2 shows the top view of a device having a stripe geometry. In the preferred embodiment, the n-type region has a doping concentration of $>1E19$ $cm^{-3}$ (referred to as a N+ region) and the P-type region adjacent to the N-type region is a P-well region and the P-type region in the middle of the JFET region is a P+ region.

Figure 3:
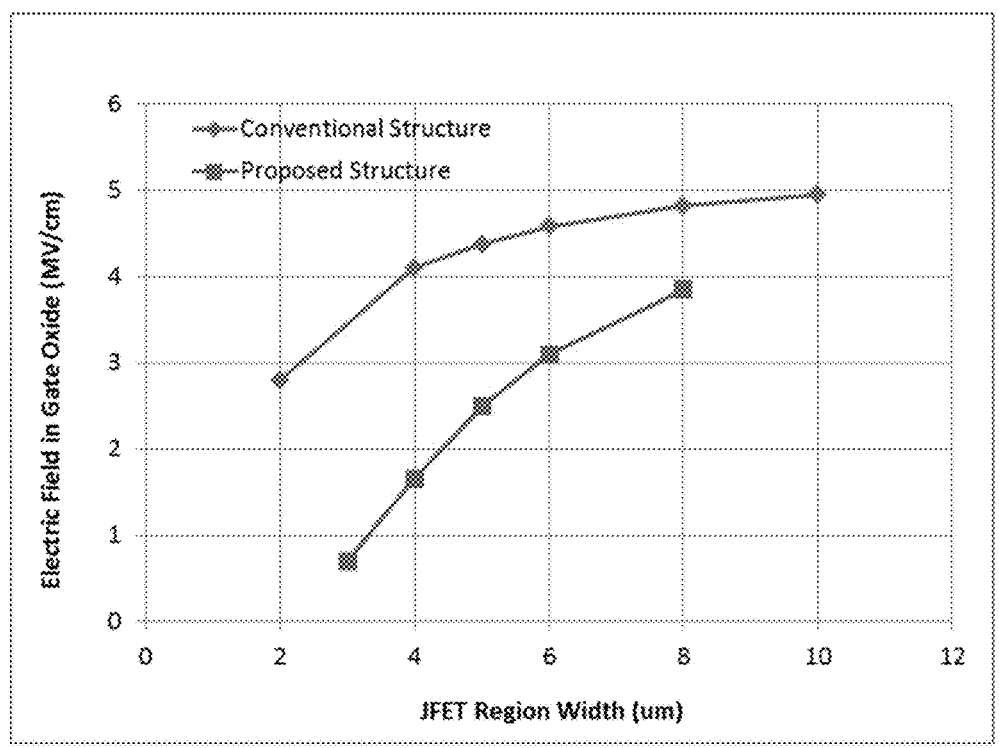
FIG. 3 is a graph showing the peak electric field in the gate oxide in the JFET region as a function of JFET region width of a conventional MOSFET and of a device as set forth in FIG. 1.

FIG. 3 is a graph comparing the electric field in the gate oxide at a drain voltage of 1200 volts as a function of the JFET width for a conventional DMOSFET structure and a DMOSFET as forth in FIG. 1. As can be seen from FIG. 3, as the JFET region width increases the electric field in the gate oxide for the conventional structure also increases due to ineffective shielding of the high drain voltage. For example, the electric field in the gate oxide for a conventional structure with 2 μm JFET region width is approximately 3 MV/cm compared to 4.5 MV/cm for a 6 μm JFET region width. As can also be seen from FIG. 3, the electric field in the gate oxide for the device of FIG. 1 is lower than the electric field for the conventional structure for a given JFET region width. The lower electric field in the FIG. 1 device is due to the improved shielding of the gate oxide by the depletion regions of the P-well-N-drift junction and P-type pillar-N-drift junction. It should be noted that the width of the P-type pillar region in this analysis was 1 μm.

To limit the electric field in the gate oxide to 3 MV/cm for improved gate oxide reliability, a JFET width of 2 μm can be used for the conventional structure and a 6 μm JFET width can be used for the device of FIG. 1. The larger JFET region width of the FIG. 1 device will enable a lower resistance of the JFET region compared to the conventional structure, particularly at higher operating temperatures.

Figure 4:
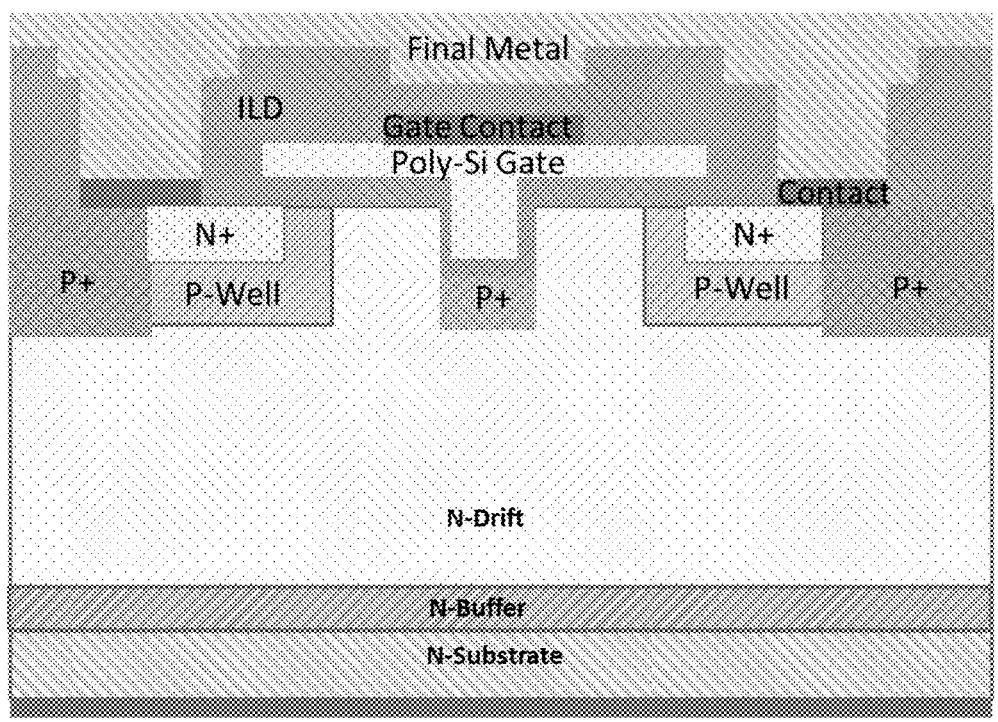
FIG. 4 is a cross-sectional view of a MOSFET according to a second embodiment comprising a p-type pillar region in the JFET region of the device wherein a trench is formed over the p-type region and interlayer dielectric and polysilicon gate are formed in the trench.
Figure 5:
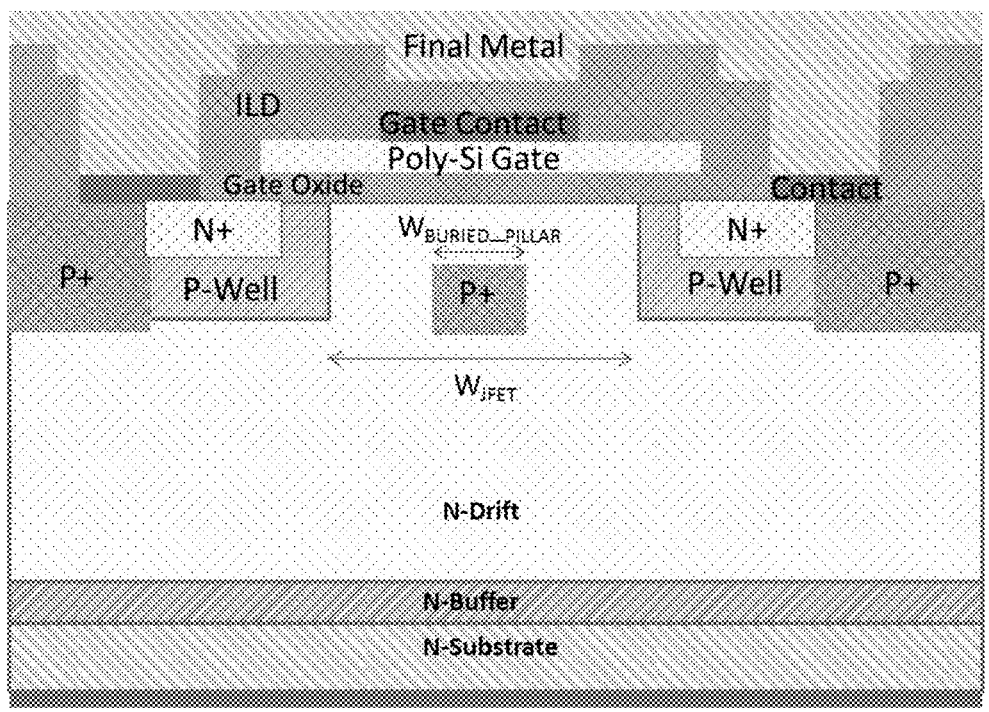
FIG. 5 is a cross-sectional view of a MOSFET according to a third embodiment comprising a buried p-type pillar region in the JFET region of the device.

FIG. 4 is a cross-sectional view of a MOSFET comprising a p-type pillar region in the JFET region of the device wherein a trench is formed over the p-type region and interlayer dielectric and poly-silicon gate are formed in the trench. As can be seen from FIG. 4, the structure comprises a trench in the middle of the JFET region. The gate oxide extends over the source regions and over the trench region. There is a P-type region below the trench as shown in FIG. 5. In the preferred embodiment, the P-type region is a heavily doped with a doping concentration greater than $5E18$ $cm^{-3}$. As also shown in FIG. 4, polysilicon gate extends over the gate oxide on both the planar and trench portion of the device. According to some embodiments, the width of the trench is 0.5 μm to 1 μm and the trench depth is 0.3 μm to 0.5 μm. According to some embodiments, the depth of P-type region below the trench is 0.2 μm to 1 μm. According to some embodiments, the width of the P-region is 1 μm or less.

FIG. 5 is a cross-sectional view of a MOSFET comprising a buried p-type pillar region in the JFET region of the device. As can be seen from FIG. 5, the device comprises a buried P-type region in the JFET region (referred to as buried P-Pillar). In the preferred embodiment, the buried p-type pillar region has a doping concentration of $1E17$ $cm^{-3}$ to $5E18$ $cm^{-3}$. According to some embodiments, the distance between the top of the buried P-Pillar and the top of the drift layer is 0.1 μm to 0.5 μm (e.g., 0.3 μm to 0.5 μm) and the distance between the bottom of the buried P-pillar and the top of the drift layer is 0.8 μm to 1 μm. According to some embodiments, the width of the JFET region is between 3 μm and 6 μm. The buried P-type region can be either floating (i.e., not connected to the p-type well regions adjacent the source regions) or connected to the p-type well regions adjacent the source regions in the third dimension (not shown in FIG. 5).

Figure 6:
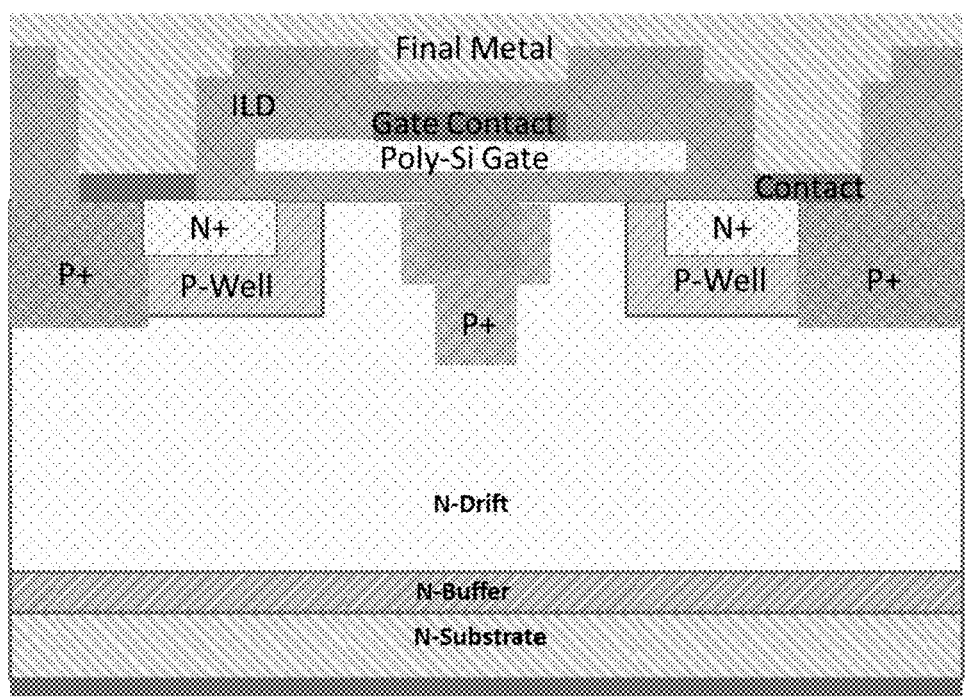
FIG. 6 is a cross-sectional view of a MOSFET according to a fourth embodiment comprising a p-type pillar region in the JFET region of the device wherein a trench is formed over the p-type pillar region and p-type material is implanted into the sidewalls of the trench and the trench is filled with interlayer dielectric material.

FIG. 6 is a cross-sectional view of a MOSFET comprising a p-type pillar region in the JFET region of the device wherein a trench is formed over the p-type pillar region and p-type material is implanted into the sidewalls of the trench and the trench is filled with interlayer dielectric material. As shown in FIG. 6, the structure comprises a trench in the middle of the JFET region. The trench is filled with a dielectric material (e.g., silicon dioxide). The gate dielectric extends over the source regions and over the trench region. As shown in FIG. 6, there is a P-type region below the trench and along the sidewalls of the trench. According to some embodiments, the P-type region is a heavily doped with a doping concentration greater than $5E18$ $cm^{-3}$. As shown in FIG. 6, the polysilicon gate extends over the gate dielectric. According to some embodiments, the width of the trench is 0.5 μm to 1 μm and the trench depth is 0.3 μm to 0.5 μm. According to some embodiments, the depth of the P-type pillar region below the trench is 0.2 μm to 1 μm and the width of the P-type pillar region is 1 μm or less.

FIGS. 7-20 show different layouts of the DMOSFET cells incorporating the P-pillar region.

Figure 7:
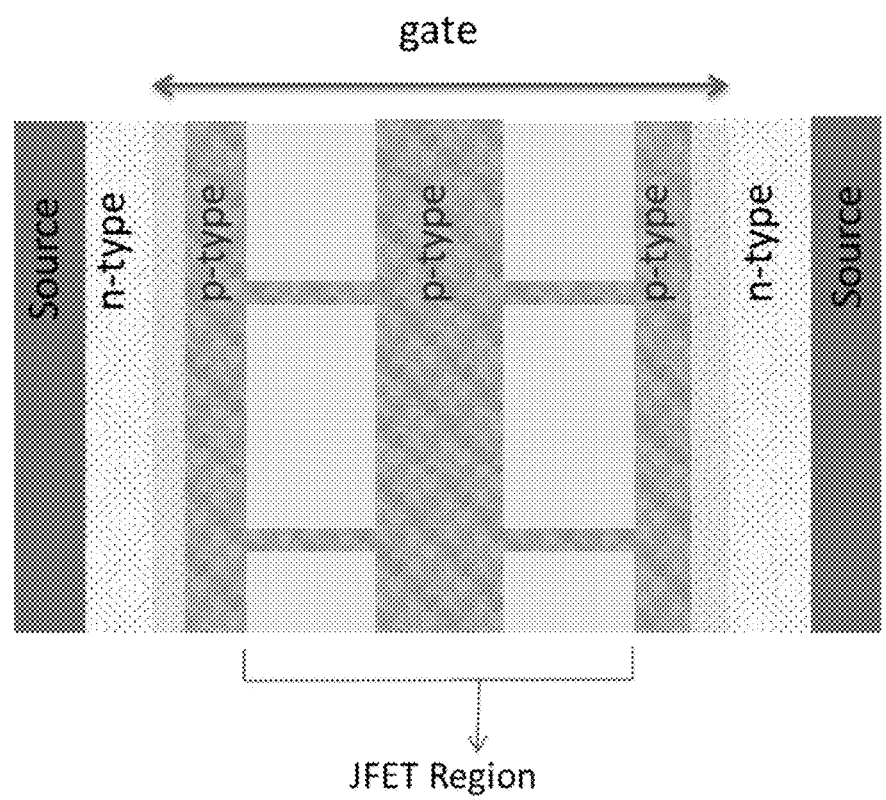
FIG. 7 is a top view of a device wherein the pillar, well and source regions are arranged as parallel stripes and wherein p-type regions connect the well regions and the pillar region.

FIG. 7 is a top view of a device wherein the pillar, well and source regions are arranged as parallel stripes and wherein additional p-type regions connect the well regions and the pillar region.

Figure 8:
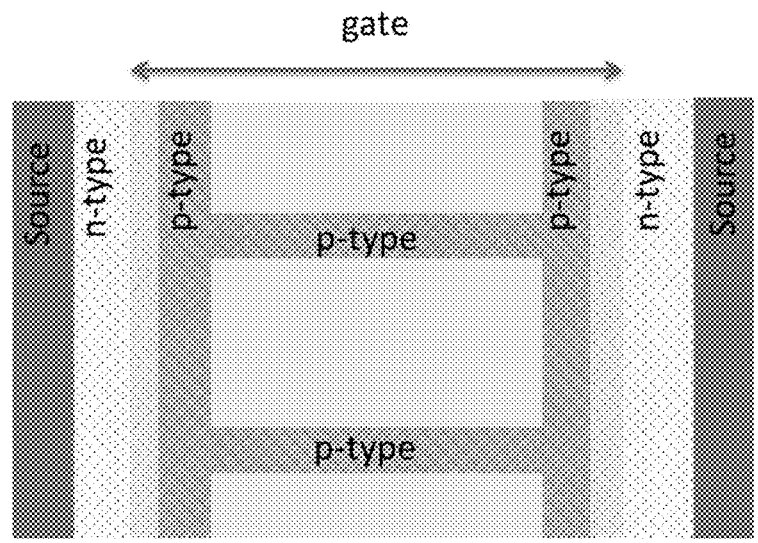
FIG. 8 is a top view of a device wherein the well and source regions are arranged as parallel stripes and wherein p-type pillar regions connect the well regions.

FIG. 8 is a top view of a device wherein the well and source regions are arranged as parallel stripes and wherein p-type pillar regions connect the well regions.

Figure 9:
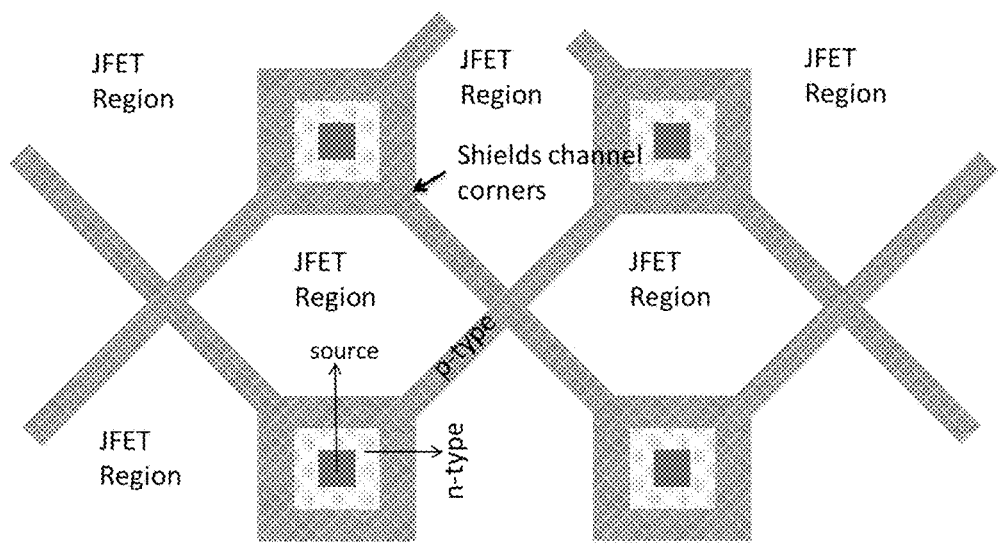
FIG. 9 is a top view of a device comprising a plurality of source regions arranged in a square pattern, wherein the well regions surrounding each of the source regions are connected to diagonally adjacent well regions by p-type pillar regions.

FIG. 9 is a top view of a device comprising a plurality of source regions arranged in a square pattern, wherein the well regions surrounding each of the source regions are connected to diagonally adjacent well regions by p-type pillar regions.

Figure 10:
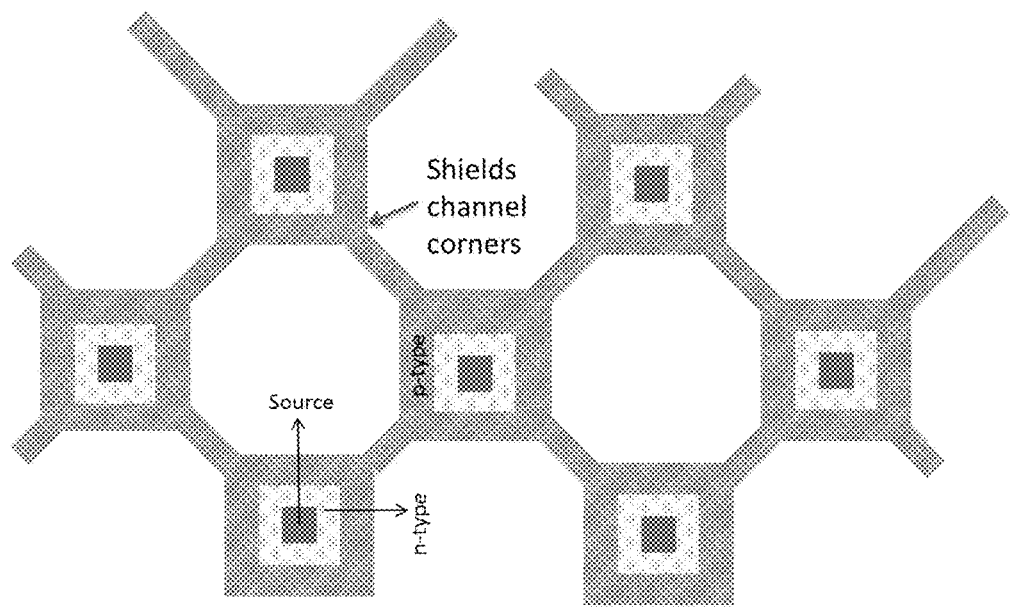
FIG. 10 is a top view of a device comprising a plurality of source regions arranged in a diamond pattern, wherein the well regions surrounding each of the source regions are connected to diagonally adjacent well regions by p-type pillar regions.

FIG. 10 is a top view of a device comprising a plurality of source regions arranged in a diamond pattern, wherein the well regions surrounding each of the source regions are connected to diagonally adjacent well regions by p-type pillar regions.

Figure 11:
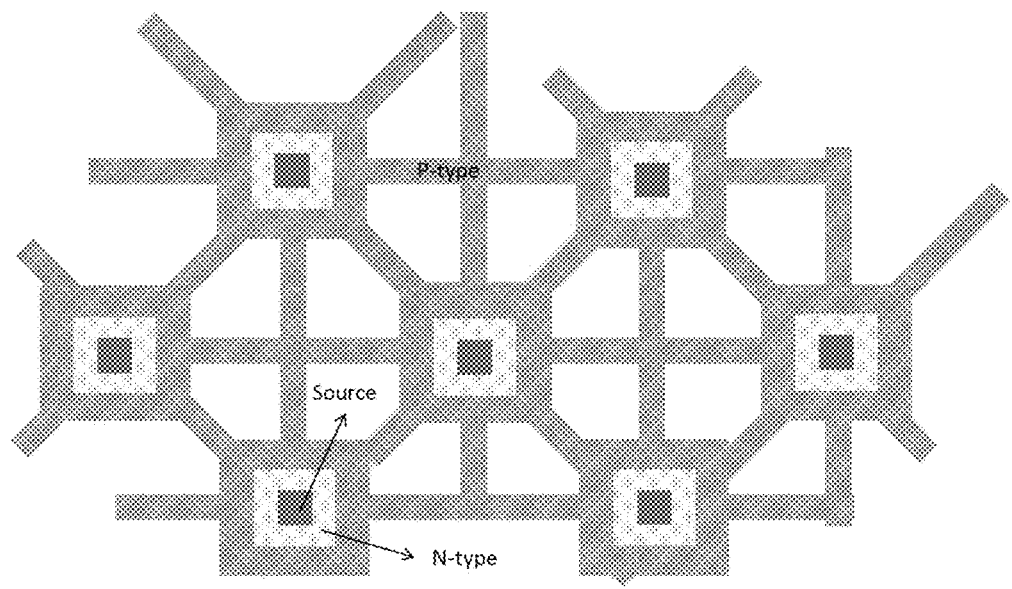
FIG. 11 is a top view of a device comprising a plurality of source regions arranged in a diamond pattern, wherein the well regions surrounding each of the source regions are connected to horizontally, vertically and diagonally adjacent well regions by p-type pillar regions.

FIG. 11 is a top view of a device comprising a plurality of source regions arranged in a diamond pattern, wherein the well regions surrounding each of the source regions are connected to horizontally, vertically and diagonally adjacent well regions by p-type pillar regions.

Figure 12:
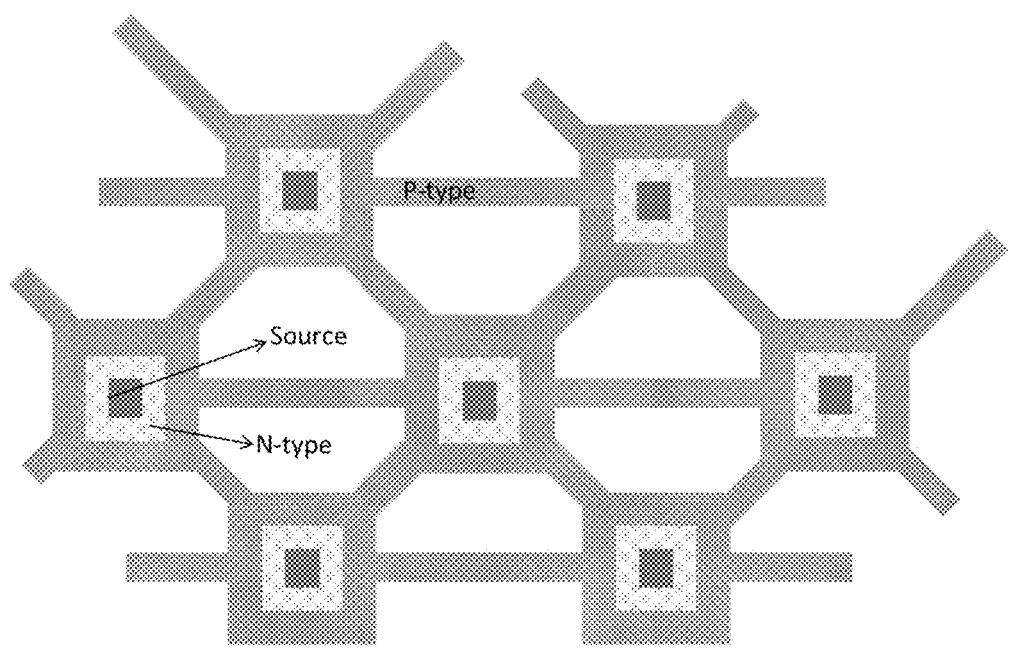
FIG. 12 is a top view of a device comprising a plurality of source regions arranged in a diamond pattern, wherein the well regions surrounding each of the source regions are connected to horizontally and diagonally adjacent well regions by p-type pillar regions.

FIG. 12 is a top view of a device comprising a plurality of source regions arranged in a diamond pattern, wherein the well regions surrounding each of the source regions are connected to horizontally and diagonally adjacent well regions by p-type pillar regions.

Figure 13:
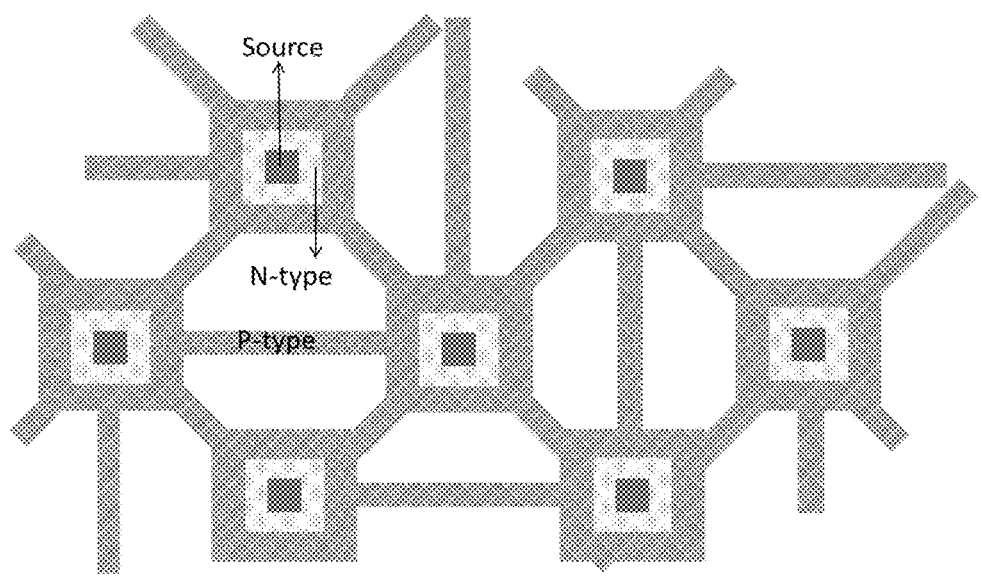
FIG. 13 is a top view of a device comprising a plurality of source regions arranged in a diamond pattern, wherein the well regions surrounding each of the source regions are connected to diagonally adjacent well regions by p-type pillar regions and wherein each of the well regions is connected to a horizontally and a vertically adjacent well region by a p-type pillar region.

FIG. 13 is a top view of a device comprising a plurality of source regions arranged in a diamond pattern, wherein the well regions surrounding each of the source regions are connected to diagonally adjacent well regions by p-type pillar regions and wherein each of the well regions is connected to a horizontally and a vertically adjacent well region by a p-type pillar region.

Figure 14:
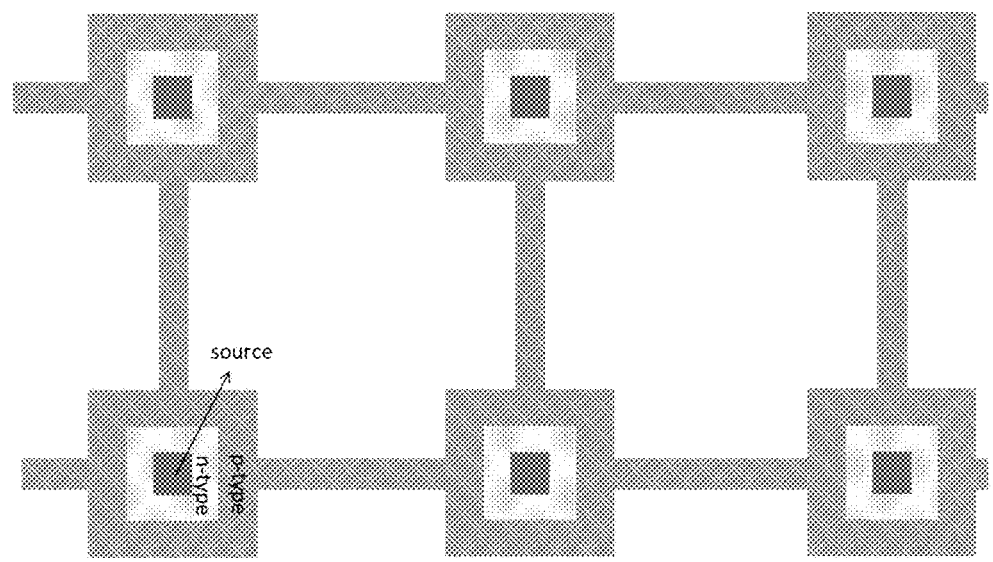
FIG. 14 is a top view of a device comprising a plurality of source regions arranged in a square pattern, wherein the well regions surrounding each of the source regions are connected to horizontally and vertically adjacent well regions by p-type pillar regions.

FIG. 14 is a top view of a device comprising a plurality of source regions arranged in a square pattern, wherein the well regions surrounding each of the source regions are connected to horizontally and vertically adjacent well regions by p-type pillar regions.

Figure 15:
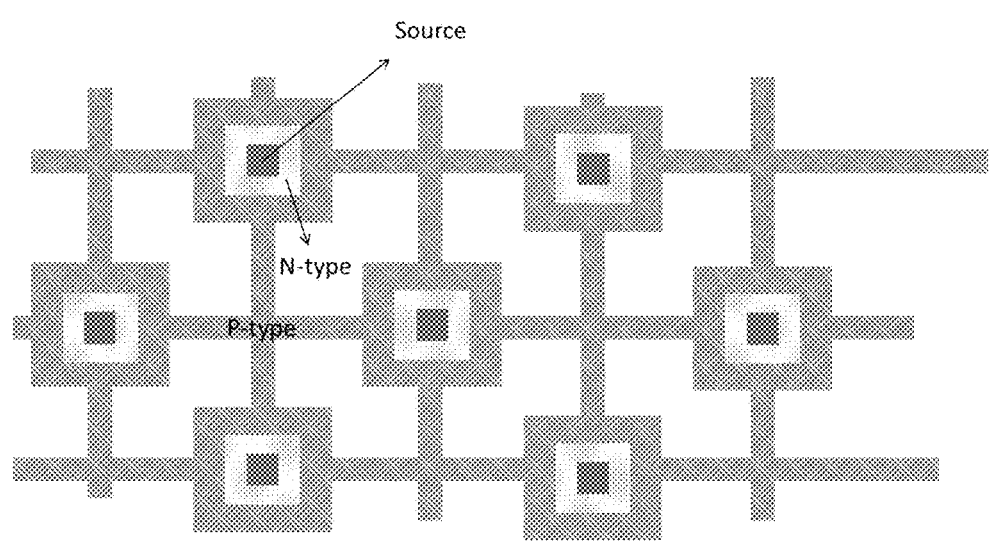
FIG. 15 is a top view of a device comprising a plurality of source regions arranged in a diamond pattern, wherein the well regions surrounding each of the source regions are connected to horizontally and vertically adjacent well regions by p-type pillar regions.
Figure 16:
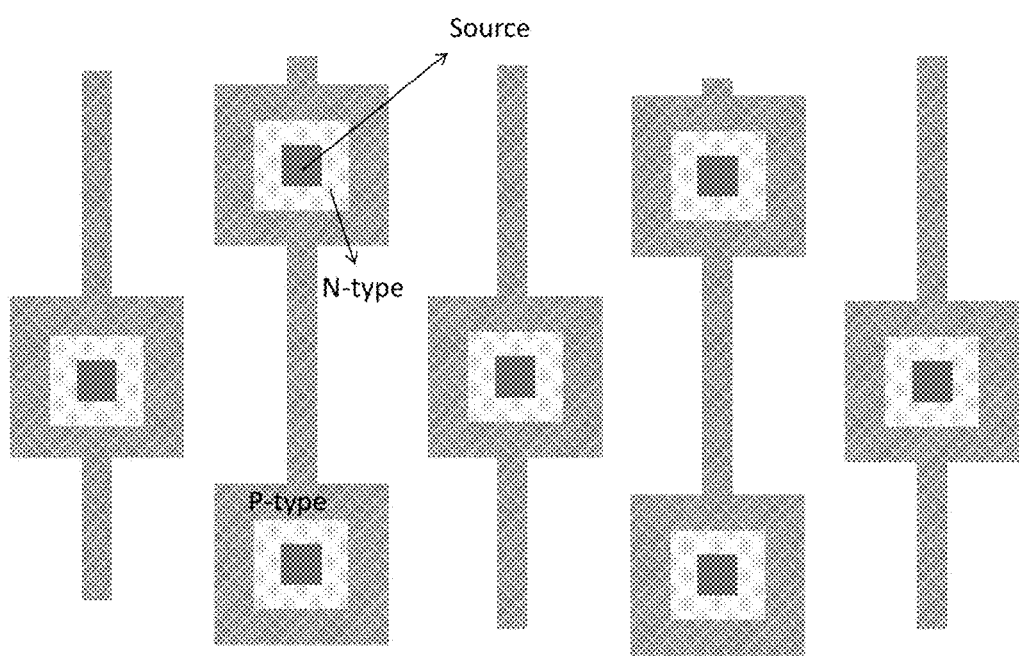
FIG. 16 is a top view of a device comprising a plurality of source regions arranged in a diamond pattern, wherein the well regions surrounding each of the source regions are connected to vertically adjacent well regions by p-type pillar regions.

FIG. 15 is a top view of a device comprising a plurality of source regions arranged in a diamond pattern, wherein the well regions surrounding each of the source regions are connected to horizontally and vertically adjacent well regions by p-type pillar regions;

FIG. 16 is a top view of a device comprising a plurality of source regions arranged in a diamond pattern, wherein the well regions surrounding each of the source regions are connected to vertically adjacent well regions by p-type pillar regions.

Figure 17:
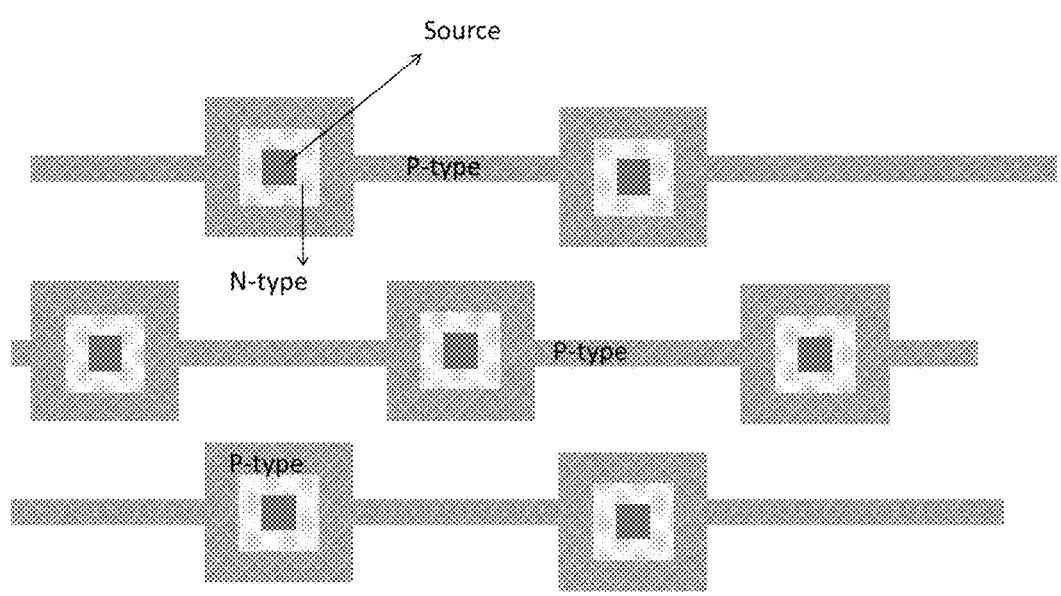
FIG. 17 is a top view of a device comprising a plurality of source regions arranged in a diamond pattern, wherein the well regions surrounding each of the source regions are connected to horizontally adjacent well regions by p-type pillar regions.

FIG. 17 is a top view of a device comprising a plurality of source regions arranged in a diamond pattern, wherein the well regions surrounding each of the source regions are connected to horizontally adjacent well regions by p-type pillar regions.

Figure 18:
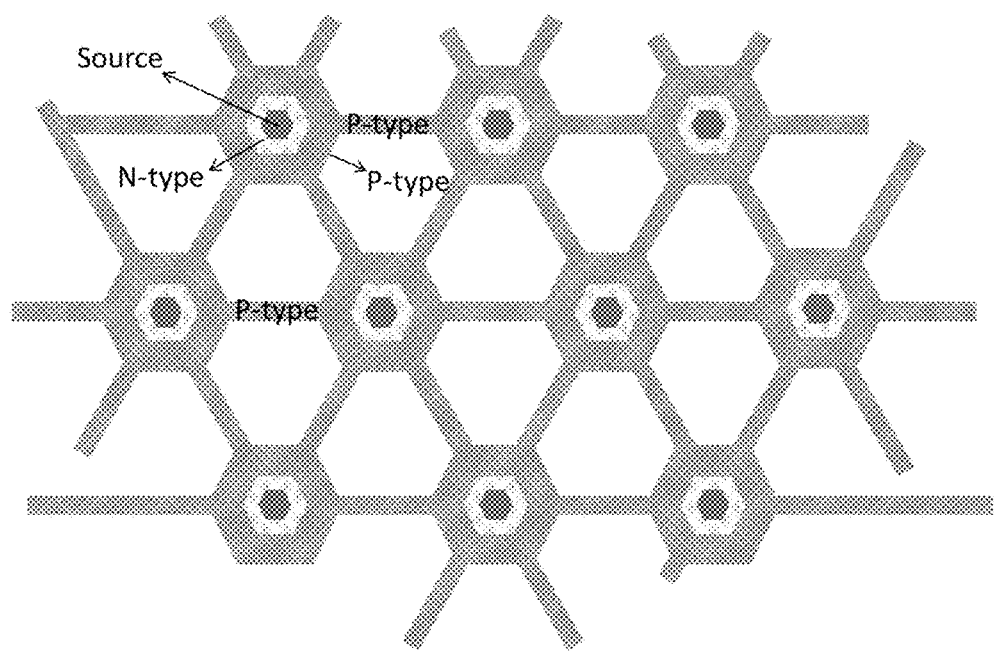
FIG. 18 is a top view of a device comprising a plurality of source regions arranged in a hexagonal pattern, wherein the well regions surrounding each of the source regions are connected to adjacent well regions by p-type pillar regions.

FIG. 18 is a top view of a device comprising a plurality of source regions arranged in a hexagonal pattern, wherein the well regions surrounding each of the source regions are connected to adjacent well regions by p-type pillar regions.

Figure 19:
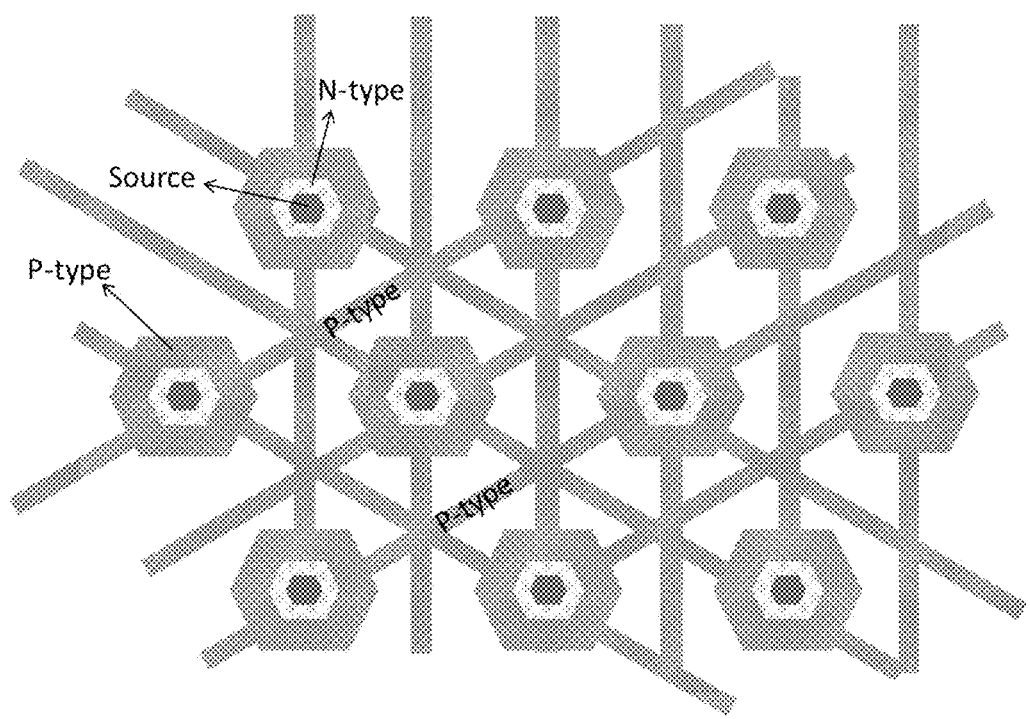
FIG. 19 is a top views of a device comprising a plurality of source regions arranged in a hexagonal pattern, wherein the well regions surrounding each of the source regions are connected to diagonally and vertically non-adjacent well regions by p-type pillar regions.

FIG. 19 is a top views of a device comprising a plurality of source regions arranged in a hexagonal pattern, wherein the well regions surrounding each of the source regions are connected to diagonally and vertically non-adjacent well regions by p-type pillar regions.

Figure 20:
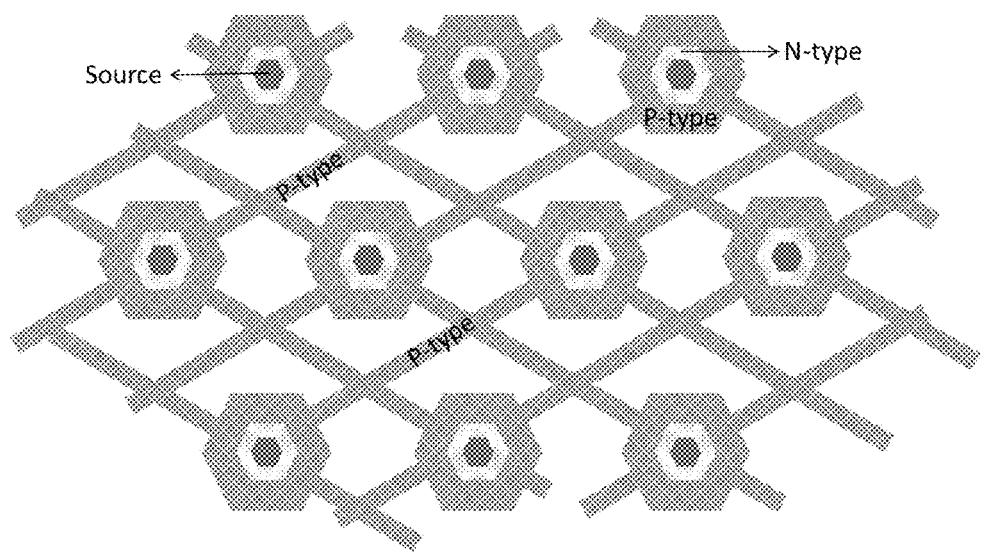
FIG. 20 is a top views of a device comprising a plurality of source regions arranged in a hexagonal pattern, wherein the well regions surrounding each of the source regions are connected to diagonally non-adjacent well regions by p-type pillar regions.

FIG. 20 is a top views of a device comprising a plurality of source regions arranged in a hexagonal pattern, wherein the well regions surrounding each of the source regions are connected to diagonally non-adjacent well regions by p-type pillar regions.

The cellular geometry of the device can be implemented along the major flat of the silicon carbide wafer or at an angle of 90 degrees with respect the major flat.

Figure 21A:
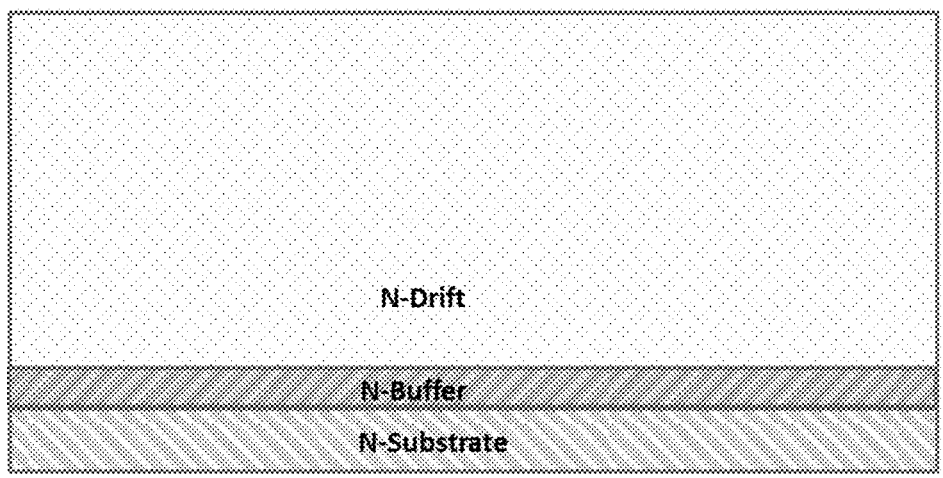
FIGS. 21A-G illustrate a method of making a device as set forth in FIG. 1.
Figure 21B:
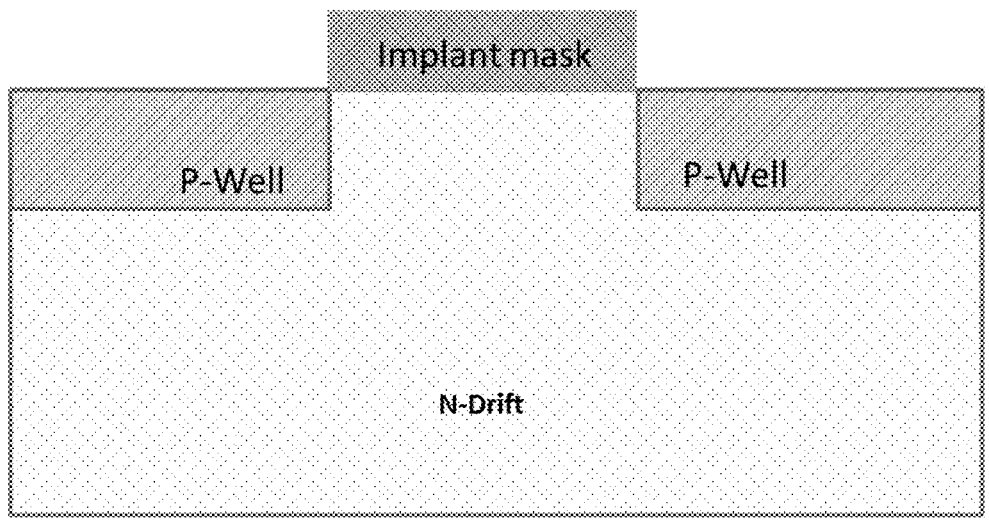
Figure 21C:
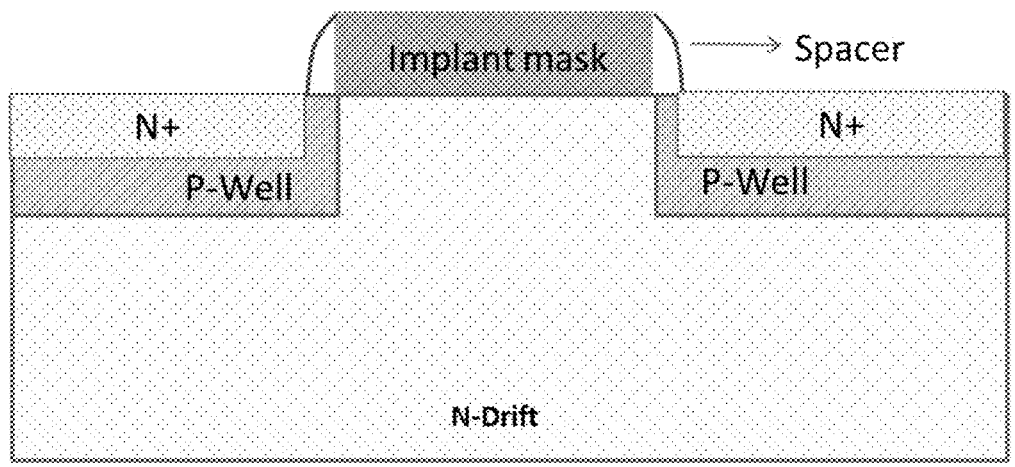

FIGS. 21A-G illustrate a method of making a device as set forth in FIG. 1. As shown in FIGS. 21A and B, an implant mask is formed on a n-type drift layer wherein the n-type drift layer is on an optional n-type buffer layer which is on an n-type substrate. As shown in FIG. 21C, spacers are then formed on the sidewalls of the implant mask. A spacer is a dielectric layer (e.g., silicon dioxide or silicon nitride) formed on the sidewall of a pre-existing pattern (e.g., an implant masking silicon dioxide layer). Spacers can be formed by a dielectric deposition step and followed by an anisotropic etching step. First a layer of dielectric material is deposited over the existing pattern. According to some embodiments, the pre-existing pattern can be a silicon dioxide implant mask over a semiconductor layer. Subsequently, the dielectric material is completely removed from the horizontal surface of the semiconductor layer by an anisotropic etch using, for example, a Reactive Ion Etching (RIE) process. This results in a layer of dielectric material on the sidewalls of the pre-existing pattern. The sidewall width of the spacer can be adjusted by adjusting the thickness of the dielectric material that is deposited over the pre-existing pattern.

Figure 21D:
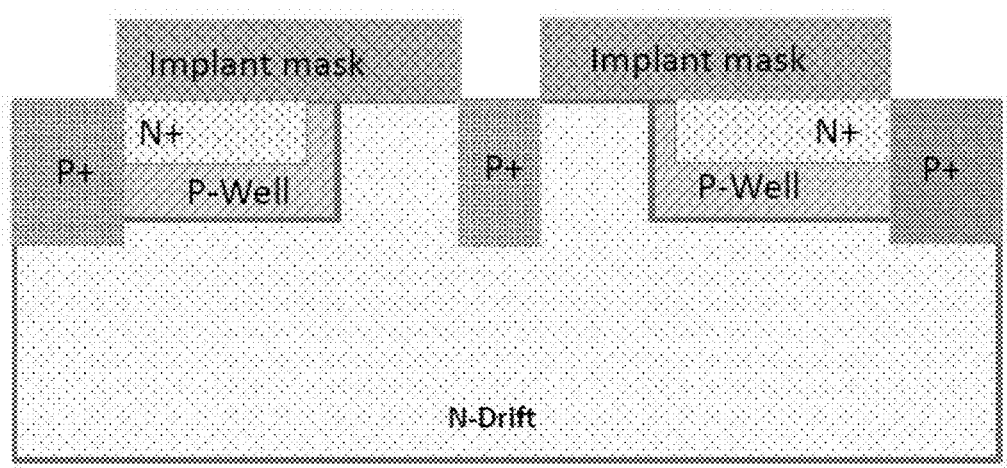
Figure 21E:
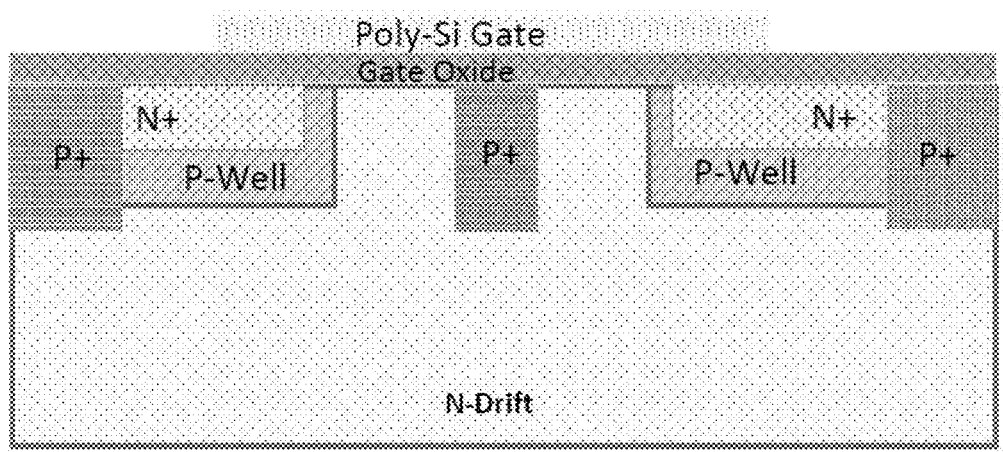
Figure 21F:
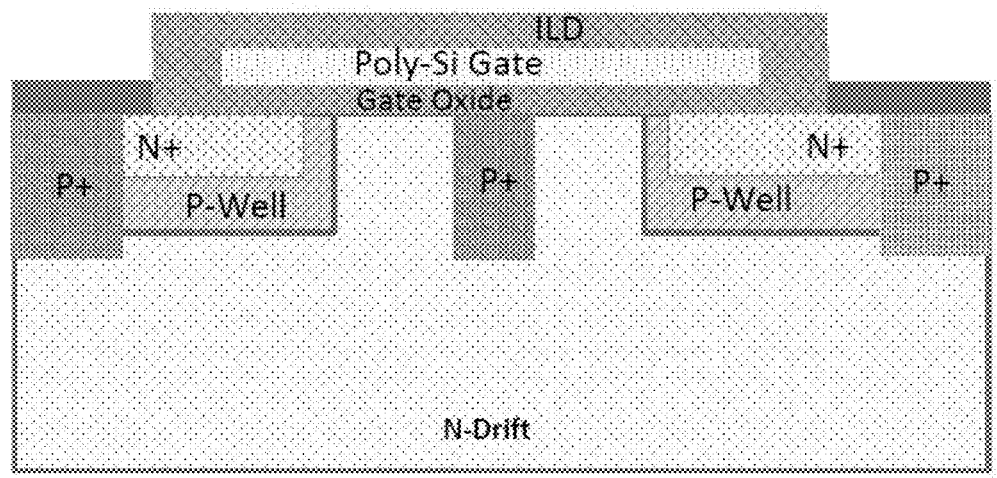
Figure 21G:
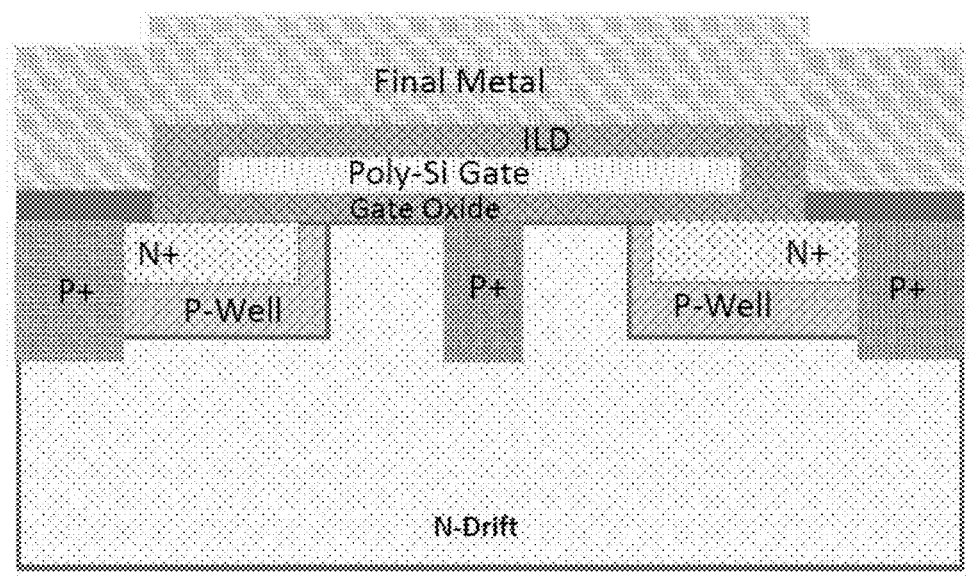

As shown in FIG. 21D, a second implant mask is used to form p+-type pillar and outer p-type regions. FIG. 21E shows gate oxide formation and polysilicon deposition, patterning and etching. FIG. 21F show inter-level dielectric formation and source contact formation. Drain contacts (not shown in FIG. 21F) could also be formed at this stage of the process. FIG. 21G shows final metal deposition.

Figure 22:
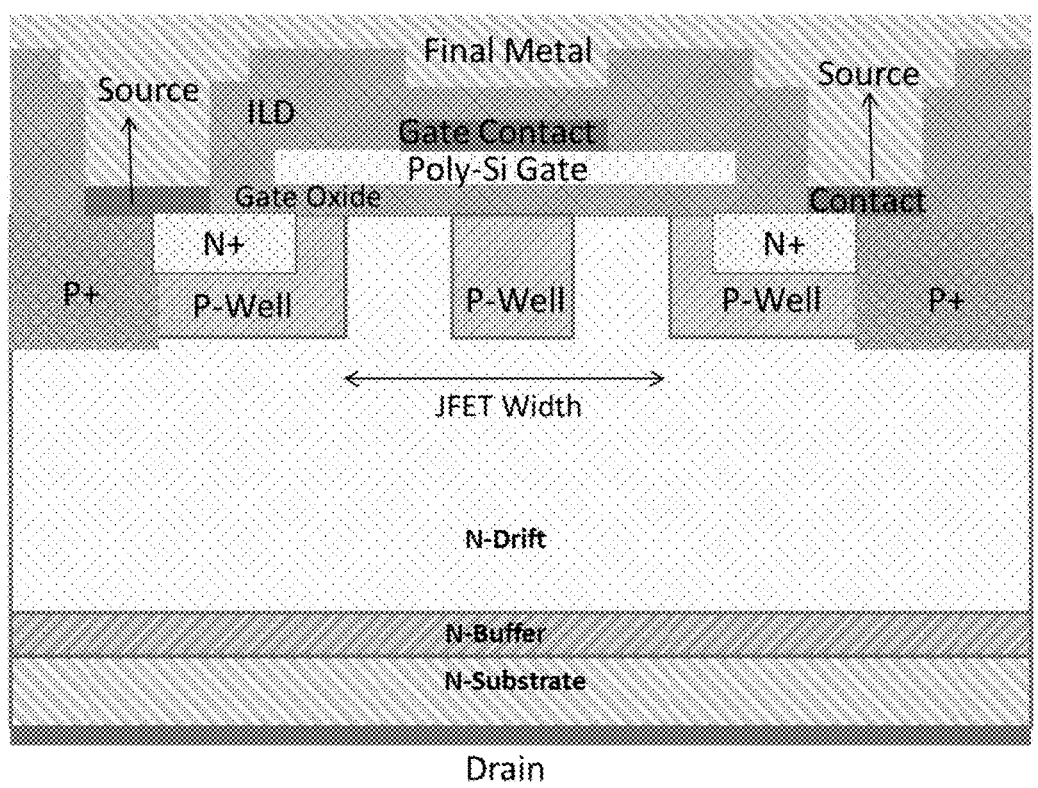
FIG. 22 is a cross-sectional view of a MOSFET comprising a p-type pillar region between the p-type well regions of the device, wherein the p-type pillar region has the same dopant concentration as the p-type well regions.

FIG. 22 is a cross-sectional view of a MOSFET comprising a p-type pillar region between the p-type well regions of the device wherein the p-type pillar region has the same dopant concentration as the p-type well regions.

Figure 23A:
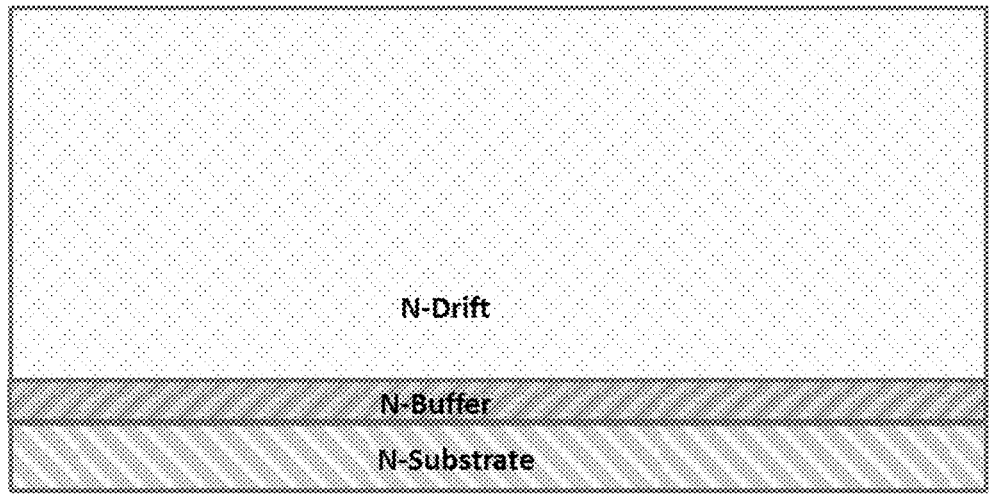
FIGS. 23A-C illustrate a method of making a device as set forth in FIG. 22.
Figure 23B:
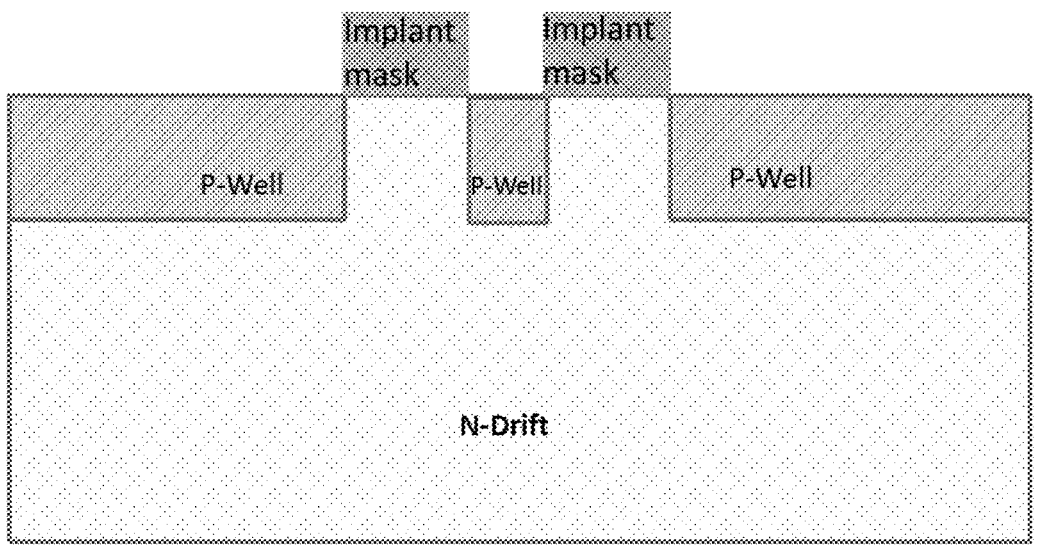
Figure 23C:
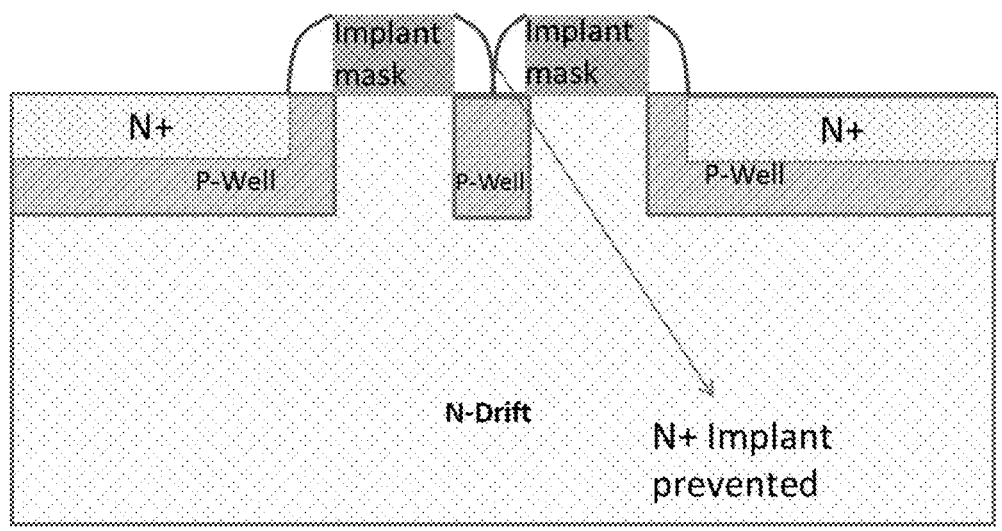

FIGS. 23A-C illustrate a method of making a device as set forth in FIG. 22. As shown in FIG. 23A, the starting material comprises an N-drift layer over an optional n-type buffer layer over and an N-substrate layer. As shown in FIG. 23B, an implant masking oxide is patterned to define the P-well regions as well as the P-pillar regions in the middle of the first and second well regions. As shown in FIG. 23C, a spacer is formed on the sidewalls of the implant masking oxide. Subsequently, the N-type source region is implanted while the semiconductor layer underneath the spacer and the P-well implant mask is protected from the N-type implant. For the device shown in FIGS. 23A-C, the thickness of the spacer on the sidewalls defines the channel length of the DMOSFET. As shown in FIGS. 23A-C, by suitably adjusting the width of the P-pillar region and the width of the spacer region, the N-type implant is blocked from the P-pillar region due to the merging of the spacers in the middle of the JFET region.

Many modifications and other embodiments of the inventions set forth herein will come to mind to those skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

While the foregoing specification teaches the principles of the present invention, with examples provided for the purpose of illustration, it will be appreciated by one skilled in the art from reading this disclosure that various changes in form and detail can be made without departing from the true scope of the invention.

What is claimed is:

1. A semiconductor device comprising:
   a semiconductor substrate layer
   a drift layer of a semiconductor material of a first conductivity type on the semiconductor substrate layer;
   a first well region of a semiconductor material of a second conductivity type different than the first conductivity type in the drift layer in a central portion of the device;
   a second well region of a semiconductor material of the second conductivity type in the drift layer in the central portion of the device and spaced from the first well region thereby defining a JFET region of the drift layer between the first and second well regions;
   a pillar region of a semiconductor material of the second conductivity type in the drift layer between the first well region and the second well region and spaced from the first well region and the second well region;
   a first source region of a semiconductor material of the first conductivity in the first well region;
   a second source region of a semiconductor material of the first conductivity in the second well region;
   a first gate dielectric layer on the drift layer and in contact with the first source region and the second source region;
   a gate electrode on a central portion of the first gate dielectric layer, the gate electrode comprising a lower surface on the first gate dielectric layer, an upper surface opposite the lower surface and sidewalls;
   an interlayer dielectric on the gate electrode and on a peripheral portion of the first gate dielectric layer not covered by the gate electrode;
   source ohmic contacts on the source regions; and a source metal region in contact with the source ohmic contacts;

wherein the first and second source regions are spaced from an inner edge of the first and second well regions adjacent the JFET region to define first and second channel regions of material of the second conductivity type between the source regions and the JFET region;

wherein the depth of the pillar region is equal to or greater than the depth of the first and second well regions;

wherein the device further comprises a trench comprising sidewalls and a bottom surface in the JFET region of the drift layer;

wherein the trench is spaced from the first well region and the second well region;

wherein the pillar region is below the bottom surface of the trench; and wherein the pillar region is on the sidewalls and bottom surface of the trench and wherein the trench is filled with a dielectric material.

2. The semiconductor device of claim 1, wherein the first and second well regions and the pillar region are elongate and oriented in a first direction, the device further comprising:

one or more p-type regions in the drift layer connecting the first well region to the pillar region; and one or more p-type regions in the drift layer connecting the second well region to the pillar region.

3. The semiconductor device of claim 1, wherein the second well region is spaced 3 µm to 6 µm from the first well region.

4. The semiconductor device of claim 1, wherein:
the width of the pillar region is 1 µm or less; and/or
the depth of the pillar region is 0.2 µm to 1 µm.

5. The semiconductor device of claim 1, wherein the doping concentration of the pillar region is greater than $5 \times 10^{18}$ cm$^{-3}$.

6. The semiconductor device of claim 1, wherein:
the doping concentration of the first and second well regions is greater than $1 \times 10^{17}$ cm$^{-3}$;
the depth of the first and second well regions is greater than 0.5 µm and less than 1 µm; and/or
the width of the first and second well regions is greater than 0.5 µm and less than 10 µm.

7. The semiconductor device of claim 1, wherein:
the doping concentration of the drift layer is $1 \times 10^{14}$ cm$^{-3}$ to $5 \times 10^{16}$ cm$^{-3}$; and/or
the thickness of the drift layer is 5 µm to 100 µm.

8. The semiconductor device of claim 1, wherein the device comprises a buffer layer of a semiconductor material of the first conductivity type between the semiconductor substrate layer and the drift layer and wherein:
the thickness of buffer layer is 1 µm to 10 µm; and/or
the doping concentration of the buffer layer is between $1 \times 10^{16}$ cm$^{-3}$ to $1 \times 10^{18}$ cm$^{-3}$.

9. The semiconductor device of claim 1, wherein the substrate layer is of the second conductivity type and the device is an IGBT.

10. The semiconductor device of claim 1, wherein the substrate layer is of the first conductivity type and the device is a MOSFET device.

11. The semiconductor device of claim 1, further comprising:

a first outer region of semiconductor material of the second conductivity type adjacent the first source region opposite the first channel region; and a second outer region of semiconductor material of the second conductivity type adjacent the second source region opposite the second channel region.

12. The semiconductor device of claim 11, wherein the first and second outer regions have the same dopant concentration as the pillar region.

* * * * *